United States Patent [19]

Jones et al.

[11] 3,881,109

[45] Apr. 29, 1975

[54] SYNTHETIC MATERIALS AND ELECTRICAL AND ELECTRONIC DEVICES MADE FROM THEM

[75] Inventors: Gordon Robert Jones; Norman Shaw, both of Malvern; Anthony Worswick Vere, Whyteleaf, near Caterham, all of England

[73] Assignee: British Secretary of State for Defence, London, England

[22] Filed: Nov. 7, 1973

[21] Appl. No.: 413,754

[30] Foreign Application Priority Data

Nov. 9, 1972 United Kingdom .............. 51699/72

[52] U.S. Cl. .................................. 250/338; 136/213

[51] Int. Cl. .............................................. G01t 1/16

[58] Field of Search.... 250/330, 338, 340, 347–353; 423/325, 326; 136/213

[56] References Cited

UNITED STATES PATENTS

| | | | |
|---|---|---|---|
| 3,774,043 | 11/1973 | Le Carvennec | 250/330 |
| 3,831,029 | 8/1974 | Jones et al. | 250/338 |

*Primary Examiner*—James W. Lawrence
*Assistant Examiner*—Davis L. Willis
*Attorney, Agent, or Firm*—Elliott I. Pollock

[57] ABSTRACT

A synthetic material has the formula $Pb_5Ge_{3-y}X_yO_{11}$, $0<y<3$. The element X is a group IV element, preferably silicon. The material may for example be used as the pyroelectric material in a pyroelectric device, such as a pyroelectric camera tube, or as the piezoelectric material in a piezoelectric device, such as a surface acoustic wave device.

6 Claims, 5 Drawing Figures

SYNTHETIC MATERIALS AND ELECTRICAL AND ELECTRONIC DEVICES MADE FROM THEM

The present invention relates to a modification of the subject matter disclosed in applicant's prior application Ser. No. 378,099 filed July 11, 1973, now U.S. Pat. No. 3,831,029 issued Aug. 20, 1974, for "Pyroelectric Device Using Lead Germanate", and is related generally to synthetic materials and electrical and electronic devices made from them and particularly to pyroelectric devices.

Pyroelectric devices use an effect known as the pyroelectric effect by which a change in the electric polarization of a pyroelectric material, leading to a change in the amount of surface charge on the material, may be produced by changing the temperature of the material. The main applications of the pyroelectric effect are in pyroelectric devices which detect infra-red radiation. There are several types of these devices which are known.

The pyroelectric effect has been known for a considerable time, but its applications have only become attractive in recent years. This has been due mainly to the development of new pyroelectric materials, particularly triglycine sulphate (TGS) and its derivatives.

Pyroelectric detection devices do not yet provide the same standard of performance as cooled photoconductive detection devices but they already provide significant advantages in convenience over photoconductive devices. It appears that pyroelectric devices will become more widely used in applications requiring a simple but sensitive detector over a wide spectral range.

It is difficult to define a single figure of merit for the purpose of comparison of various pyroelectric materials, but there is a general set of materials requirements which may be followed to achieve useful device performance. These requirements include a high pyroelectric coefficient, a low dielectric constant and a low dielectric loss. The materials which best meet these requirements at present are TGS and its derivatives. This family of compounds has, however, a number of limitations, which mainly include a relatively high water solubility and a low ferroelectric Curie temperature.

According to the present invention there is provided a synthetic material $Pb_5\,Ge_{3-y}\,X_y\,O_{11}$, where X is an element, other than carbon, lead and germanium, in group IV of the periodic table and where Y is in the range $0<y<3$, the limits of the range being exclusive.

The term "group IV" is intended to include the elements titanium, zirconium and hafnium.

The element X is preferably silicon.

The material may be used in an electrical or electronic device, particularly a pyroelectric device.

The material may be in single crystal or polycrystalline (e.g. ceramic) form.

According to an aspect of the present invention there is provided an electrical or electronic device made from a piece of the said material. The device may, for example, be a pyroelectric device (using the pyroelectric properties of the material) or alternatively an acoustic surface wave device (using the piezo-electric properties of the material).

In this specification the term X is used to represent an element, other than carbon, lead and germanium in group IV of the periodic table and the term $y$ is used to represent a numeral in the range $0<y<3$.

Embodiments of the present invention will be described by way of example with reference to the accompanying drawings, in which.

A ceramic specimen of the material $Pb_5\,Ge_{3-y}\,X_y\,O_{11}$ may be prepared as followed. A quantity of lead germanate $Pb_5\,Ge_3\,O_{11}$ (already prepared for example by a growth from the melt technique) is crushed and mixed in the required atomic proportions with a quantity of the oxide of the element X, for example $Si\,O_2$.

For instance if the material $Pb_5\,Ge_2\,Si\,O_{11}$ is required the atomic ratio of Ge to Si in the starting materials is 2:1. A wetting agent such as tetrachloroethane is added to the mixture, and the resultant wet mixture is inserted in a ball mill. Here the particles in the wet mixture are ground to a diameter of about 1 $\mu$m. The slurry is then transferred using a ladle onto a plate which is located in a screw press and subjected to a pressure of about 15 tons per square inch at room temperature (ie cold pressing) for about 15 minutes. When removed from the press the plate bearing the material is left to dry. After drying the specimen of material so formed is transferred to apparatus (illustrated in FIG. 1) for hot pressing.

Figure 1:
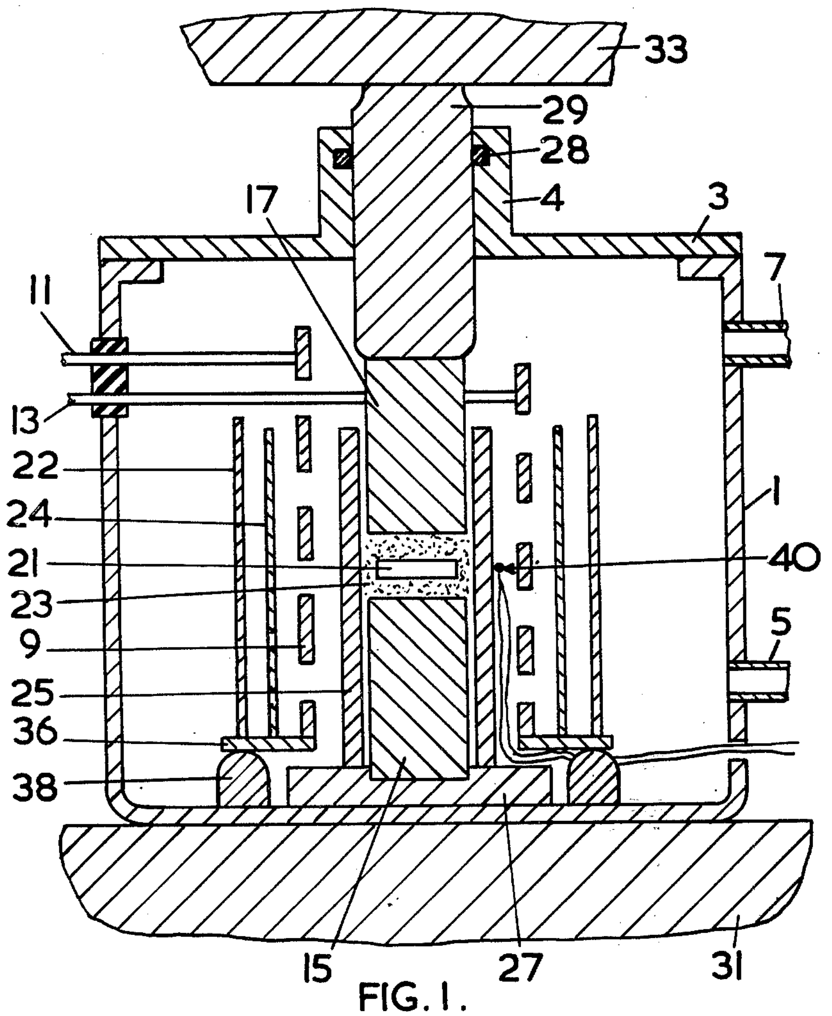
FIG. 1 is a cross-sectional diagram of apparatus which may be used to produce ceramic specimens of the material $Pb_5\,Ge_{3-y}\,X_y\,O_{11}$.

FIG. 1 is a cross-sectional diagram of apparatus which may be used to produce ceramic specimens of the material $Pb_5\,Ge_{3-y}\,X_y\,O_{11}$, by hot pressing. A vessel 1 (which may be water cooled by means not shown) has a lid 3, a gas inlet port 5 and a gas outlet port 7. A hardened steel block 27 rests on the base of the vessel 1. The block 27 contains a recess in which an alumina rod 15 rests. An alumina rod 17 is positioned above and coaxial with the rod 15. In the space between the end of the adjacent ends of the rod 15 and the rod 17 is located a specimen 21 (produced by cold pressing) to be hot pressed. The specimen 21 is embedded in granular alumina 23 contained in the space by a sleeve 25 which fits closely around the rod 15 and part of the rod 17. An asbestos shelf 36 rests on alumina supports 38 on the base of the vessel 1. A silicon carbide electrical resistance heating spiral 9 rests on the shelf 36 and is located around the rods 15, 17, the specimen 21 and the sleeve 25. The spiral 9 is supplied with energy through conducting leads 11, 13 from an energy source (not shown). Nickel radiation shields 22 and 24 also rest on the shelf 36 and are located around the spiral 9. A tungsten carbide anvil 29 passes slidably through a neck 4 having an O-ring seal 28 in the lid 3. The lower end of the anvil 29 is inside the vessel 1 and rests on the rod 17. The base of the vessel 1 rests on a screw press platen 31, and a screw press platen 33 is arranged to press against the anvil 29. A thermocouple 40 (having alumina sheathed leads) is positioned between the spiral 9 and the sleeve 25 in a region adjacent to the specimen 21.

The apparatus described with reference to FIG. 1 may be used as follows. The vessel 1 is lightly evacuated via the gas outlet port 7, and inert gas is admitted into the vessel 1 via the gas inlet port 5. The temperature inside the vessel 1 which is measured by the thermocouple 40, is raised to a temperature of between about 600° and 700°C depending on the composition of the desired material. (For example, a temperature of about 650°C is suitable for the material $Pb_5\ Ge_2\ Si\ O_{11}$). Pressure is applied to the specimen 21 by the screw press. The pressure is raised to about 1½ tons per square inch. The temperature and pressure are then held constant and the specimen 21 is hot pressed for a period depending on the physical properties required of the prepared material but normally in the range of between 2 and 10 hours.

The material produced is a ceramic specimen. It may be a material in which the atoms of the germanium and the element X are in solid solution, or it may be a truly congruently melting material (like the garnets) such as the compound $Pb_5\ Ge_2\ Si\ O_{11}$ or the compound $Pb_5\ Ge\ Si_2\ O_{11}$. Alternatively, it may be a mixture of both, ie a multi-phase material.

Figure 2:
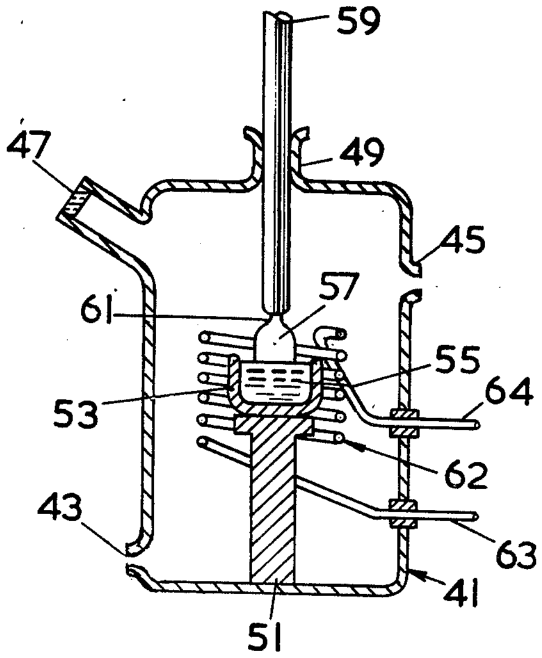
FIG. 2 is a cross-sectional of apparatus which may be used to produce single crystals of the material $Pb_5\,Ge_{3-y}\,X_y\,O_{11}$.

FIG. 2 is a cross-sectional diagram of apparatus which may be used to grow material by pulling from the melt. A vessel 41 has a gas inlet port 43, a gas outlet port 45, a neck 49 and a window 47 for observing the progress of crystal growth inside the vessel 41.

A crucible holder 51 is secured to the base of the vessel 41 and carries a crucible 53 which may be made of gold or platinum. The crucible 53 is used to contain a charge 55 of material from which a single crystal 57 is grown by a pull rod 59 having a seed 61 attached to the end thereof. The pull rod 59 passes through the neck 49 of the vessel 41 and may be moved vertically and also rotated by conventional means (not shown). The charge 55 is heated by a coil 62 (either an rf or resistance heater coil) supplied with energy through conducting leads 63, 64 from an energy source (not shown).

A single crystal 57 of the material $Pb_5\ Ge_{3-y}\ X_y\ O_{11}$ may be grown as follows. The oxides PbO, $GeO_2$ and an oxide of the group IV element X (for example the oxide $Si\ O_2$) are placed in the crucible 53. The oxides must be in the correct atomic proportions for the required material. For example, if the material $Pb_5\ Ge_2\ Si\ O_{11}$ is required then the required atomic percentages of the starting materials are 62.5 atomic % PbO, 25 atomic % $GeO_2$ and 12.5 atomic % $Si\ O_2$ to give the reaction:

$$5\ PbO + 2\ Ge\ O_2 + Si\ O_2 \rightarrow Pb_5\ Ge_2\ Si\ O_{11}$$

The vessel 41 is evacuated via the gas outlet port 45, and inert gas (for example argon) is admitted to the vessel 41 via the gas inlet port 43. The temperature of the charge 55 is raised until the charge 55 is molten (at about 750°C). The pull rod 59 is then lowered so that the seed 61 dips into the molten charge 53. The pull rod 59 is then raised slowly away from the melt at a rate of about 1 mm per hour and rotated allowing the single crystal 57 to grow. A liquid solid interface temperature gradient of about 20°C/mm is suitable.

Single crystals of the material $Pb_5\ Ge_{3-y}\ X_y\ O_{11}$, may alternatively be prepared by any of the other known growth-from-the-melt techniques involving a moving liquid/solid interface, for example one of the Stockbarger, Bridgmas or Kyropulos techniques or zone melting.

The single crystal produced may be one in which the atoms of the germanium and the element X are in solid solution. Alternatively it may be a crystal of a true compound such as $Pb_5\ Ge_2\ Si\ O_{11}$ or $Pb_5\ Ge\ Si_2\ O_{11}$.

The proportion of Ge to X (the other group IV element) in the material whether grown either in ceramic or single crystal form will depend on the physical properties required of the material. For example the material $Pb_5\ Ge_{3-z}\ Si_z\ O_{11}$ where z is in the range $0<z \leq 2.1$ shows favorable pyroelectric properties.

The ferroelectric and piezoelectric and other properties of this material may also be exploited in a device.

Figure 3:
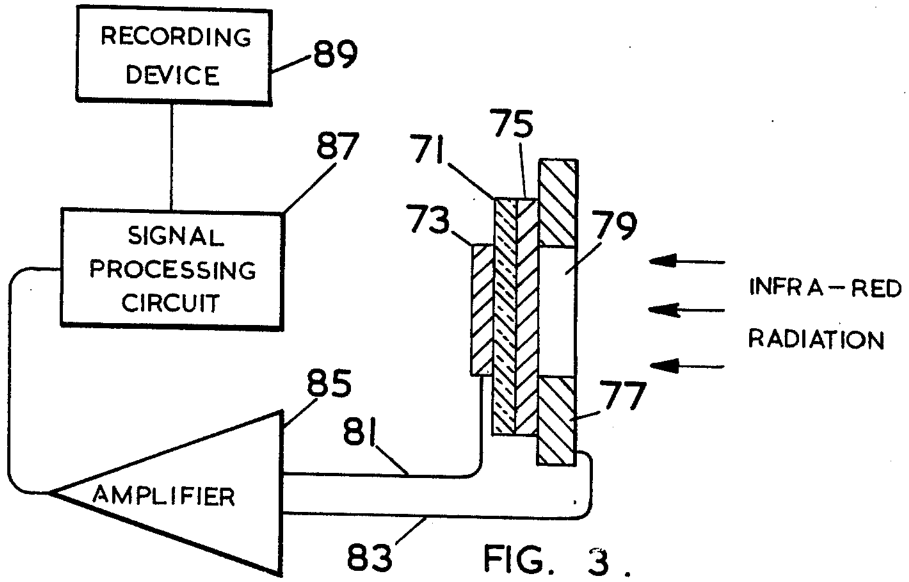
FIG. 3 is a diagram, partly in cross-section and partly in schematic circuit form, of a single element pyroelectric detector, embodying one aspect of the present invention.

FIG. 3 is a diagram partly in cross-section and partly in schematic circuit form of a single element pyroelectric infrared detector embodying one aspect of the present invention. The detector includes a slice 71 of either single crystal or ceramic material $Pb_5\ Ge_{3-y}\ X_y\ O_{11}$, (for example the material $Pb_5\ Ge_2\ Si\ O_{11}$) having a thickness of less than 100 $\mu$m. The slice 71 has been conventionally "poled" using a high direct electric field to make it single domain. If the slice 71 is single crystal it is cut so that its plane is perpendicular to the trigonal "C" axis or axis of polarization. The slice 71 is sandwiched between an opaque electrode 73 (smaller in area that the slice 1) and an electrode 75 transparent to infrared radiation.

The electrode 75 and the electrode 73 may for example be made of nichrome (which is semi-transparent) and gold respectively, evaporated on the respective surfaces of the slice 71. The electrode 75 is deposited on a conducting mount 77 having an aperture 79 concentric with the electrode 73. A signal lead 81 is attached to the electrode 73, and a signal lead 83 is attached to the conducting mount 77.

When infrared radiation is incident via the electrode 75 on the slice 71 a change in the surface charge on the slice 71 occurs by virtue of the pyroelectric effect. The charge is detected as a voltage or a current by an amplifier 85 connected to the electrode 73 by the lead 81 and to the conducting mount 77 by the electrode 83. The output of the amplifier 85 is processed by a conventional signal processing circuit 87 which is used to extract the signal from noise. The output of the circuit 87 is recorded by a conventional recording device 89.

Figure 4:
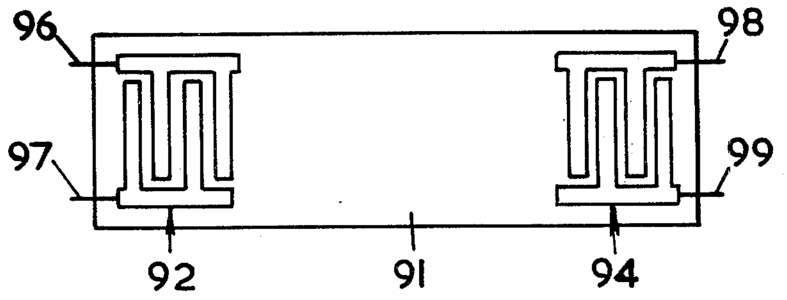
FIG. 4 is a plan view of an acoustic surface wave device embodying one aspect of the present invention.

FIG. 4 is a plan view of an acoustic surface wave device embodying one aspect of the present invention. The device includes a substrate 91 of material $Pb_5\ Ge_{3-y}\ X_y\ O_{11}$. The substrate 91 has been conventionally poled using a high direct electric field to make it single domain. An input transducer 92 is attached to the top surface of the substrate 91 at one end thereof and an output transducer 94 is attached to that surface at the other end of the substrate 91.

The transducers 92, 94 are of the conventional two-part interdigital comb type. Signal leads 96, 97 are connected to the two respective parts of the transducer 92, and signal leads 98, 99 are connected to the two respective parts of the transducer 94.

In action, when an alternating electrical signal is applied to the transducer 92 via the leads 96, 97 an acoustic surface wave is produced by the transducer 92 in the top surface of the substrate 91. This wave travels across the top surface of the substrate 91 until it reaches the transducer 94. Here, it is converted into an alternating electrical signal by the transducer 94. The alternating electrical signal is detected via the leads 98, 99.

The acoustic surface wave device described with reference to FIG. 4 may be used as an electrical delay line.

Figure 5:
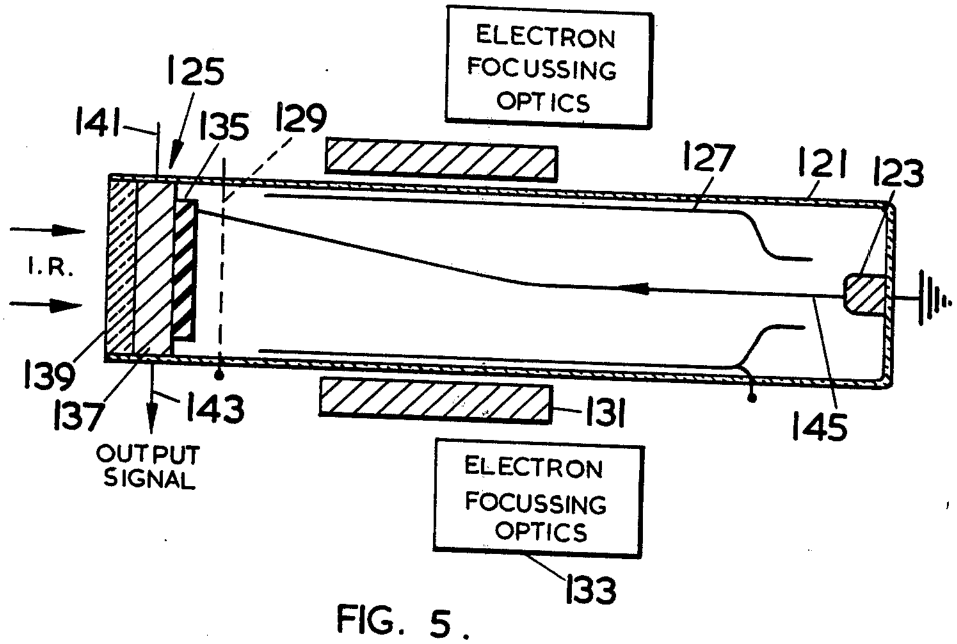
FIG. 5 is a schematic cross-sectional diagram of a pyroelectric camera tube system embodying the present invention.

The pyroelectric effect has another application in a pyroelectric camera tube system. A pyroelectric camera tube is basically the same as a conventional television camera tube but in which the photoconductive target material is replaced by pyroelectric material sensitive to infra-red instead of visible radiation. FIG. 5 is a schematic cross-sectional diagram of a pyroelectric camera tube system embodying the present invention. The camera consists basically of a vacuum tube 121 containing a cathode 123, a target 125, a grid electrode 127 generally coaxial with the tube 121 and a mesh grid electrode 129 in front of the target 125. A deflection system 131 and a conventional electron focussing system 133 are provided on the outside of the tube 121. The target 125 consists of a slice 135 of either single crystal or ceramic lead germanate silicate electrically connected to a layer 137 of material (such as nichrome) which is electrically conducting. The perimeter of the layer 137 is attached to the faceplate of the tube 121 which consists of a layer 139 of an infra-red transmitting glass. Alternatively, the layer 137 can also be the faceplate layer 139 and the slice 135 can be electrically connected to it either by being mounted directly on it or through an intermediate connection (not shown).

The layer 137 is maintained by means of a contact 141 at one side at a stable potential, relative to the potential of the cathode 123. At the other side, the layer 137 is attached to a contact 143 which is used to provide an output signal. The cathode 123 produces an electron beam 145 which is scanned across the surface of the slice 135. Infra-red radiation IR, modulated by a chopper (not shown), is incident (from a given scene)

via the layer 139 and the layer 137 on the slice 135. Wherever the layer 135 is irradiated the pyroelectric effect occurs to an extent varying with the intensity of the radiation. Electric charges are produced on the surfaces of the slice 135. The surface charge is quenched as the electron beam 145 is scanned across the surface of the layer 135. Charge then flows in the circuit comprising the layer 137 and the contacts 141 and 143 and may be detected as signal at the contact 143 which may be processed by conventional signal processing circuits (not shown) and displayed in a known way.

We claim:

1. A pyroelectric detection device comprising a piece of pyroelectric material having a compositional formula $Pb_5Ge_{3-y}X_yO_{11}$ where $y$ is in the range $0<y \leq 2.1$ and X is an element selected from group IV of the periodic table but other than carbon, germanium and lead and, electrically connected to said piece, means for detecting the pyroelectric charge developed on said piece when said piece is exposed to a change in temperature by the incidence of electromagnetic radiation on said device.

2. The pyroelectric device of claim 1 wherein said element X is silicon.

3. The pyroelectric device of claim 1 wherein said element X is selected from group IVa of the periodic table which consists of titanium, zirconium and hafnium.

4. The pyroelectric device of claim 1 wherein said piece is in a single crystal form.

5. The pyroelectric device of claim 2 wherein said piece is in a polycrystalline ceramic form.

6. The pyroelectric device of claim 2 wherein said piece is of a compound having the formula $Pb_5Ge_2SiO_{11}$.

* * * * *